(12) United States Patent
Jeong

(10) Patent No.: US 10,381,093 B2
(45) Date of Patent: Aug. 13, 2019

(54) NONVOLATILE MEMORY DEVICE FOR SUPPRESSING READ DISTURBANCES

(71) Applicant: SK hynix Inc., Icheon-si Gyeonggi-do (KR)

(72) Inventor: Hoe Sam Jeong, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 454 days.

(21) Appl. No.: 15/232,960

(22) Filed: Aug. 10, 2016

(65) Prior Publication Data
US 2017/0294232 A1    Oct. 12, 2017

(30) Foreign Application Priority Data

Apr. 11, 2016  (KR) .......................... 10-2016-0044100

(51) Int. Cl.
  G11C 16/04    (2006.01)
  G11C 16/26    (2006.01)
  G11C 16/30    (2006.01)
  G11C 16/34    (2006.01)

(52) U.S. Cl.
  CPC ...... G11C 16/3427 (2013.01); G11C 16/0408 (2013.01); G11C 16/26 (2013.01); G11C 16/30 (2013.01)

(58) Field of Classification Search
  CPC ..... G11C 16/0408; G11C 16/26; G11C 16/30; G11C 16/3427
  See application file for complete search history.

(56) References Cited

U.S. PATENT DOCUMENTS

| | | | |
|---|---|---|---|
| 5,784,384 A * | 7/1998 | Maeno | G11C 11/41 714/726 |
| 2009/0003033 A1* | 1/2009 | Nirschl | G11C 13/00 365/148 |
| 2011/0255347 A1 | 10/2011 | Mori et al. | |
| 2012/0235708 A1* | 9/2012 | Slamowitz | G11C 7/062 327/53 |
| 2014/0043928 A1* | 2/2014 | Lee | G11C 7/062 365/208 |

* cited by examiner

*Primary Examiner* — Harry W Byrne
*Assistant Examiner* — R Lance Reidlinger
(74) *Attorney, Agent, or Firm* — William Park & Associates Ltd.

(57) ABSTRACT

A nonvolatile memory device includes a nonvolatile memory cell, a sensing circuit coupled between a sensing input line coupled to a bit line of the nonvolatile memory cell and a sensing output line, a sensing output grounding portion fixing an output signal of the sensing circuit at a low level if the output signal of the sensing circuit has a low level, and a bit line grounding portion fixing a bit line voltage at a ground voltage if the output signal of the sensing circuit is fixed at a low level.

5 Claims, 11 Drawing Sheets

NONVOLATILE MEMORY DEVICE FOR SUPPRESSING READ DISTURBANCES

CROSS-REFERENCE TO RELATED APPLICATION

The present application claims priority under 35 U.S.C. 119(a) to Korean Application No. 10-2016-0044100, filed on Apr. 11, 2016, which is herein incorporated by reference in its entirety.

BACKGROUND

1. Technical Field

Various embodiments of the present disclosure relate to a semiconductor memory device and, more particularly, to a nonvolatile memory device for suppressing read disturbances.

2. Related Art

Semiconductor memory devices are typically classified into random access memory (RAM) devices and read only memory (ROM) devices according to data volatility thereof. The RAM devices are volatile devices, which loses stored data when power supply of the RAM device is interrupted. In contrast, the ROM devices retain stored data when power supply of the ROM device is interrupted. ROM devices may also be classified into programmable ROM (PROM) devices and mask ROM devices according to data input methods, that is, data program methods. PROM devices may be fabricated and sold without being programmed and may be directly programmed by customers (i.e., users) after fabrication of the PROM device. The mask ROM devices may be programmed during fabrication thereof using implantation masks manufactured based on data requested by users. The PROM devices may include one time PROM (OTPROM) devices, erasable PROM (EPROM) devices, and electrically erasable PROM (EEPROM) devices. Once the OTPROM devices are programmed, the programmed data of the OTPROM devices cannot be changed.

Nonvolatile memory devices, for example, the OTPROM devices employ NMOS transistors or PMOS transistors as cell transistors. If PMOS transistors are used as the cell transistors of the nonvolatile memory devices, the PMOS transistors may have a turn-off state as an initial state, and may have a turn-on state as a programmed state. A read operation of the PMOS transistors may be executed by sensing a voltage level of a bit line connected to any one selected from the PMOS transistors. In such a case, the voltage level of the bit line may be determined by a resistance ratio of a resistance of a load resistor coupled between a supply voltage line and the bit line and an equivalent resistance of the selected PMOS transistor.

SUMMARY

Various embodiments are directed to a nonvolatile memory device for suppressing a read disturbance.

A nonvolatile memory device according to an embodiment includes a nonvolatile memory cell, a sensing circuit disposed between a sensing input line coupled to a bit line of the nonvolatile memory cell and a sensing output line, a sensing output grounding portion fixing an output signal of the sensing circuit at a low level when the output signal of the sensing circuit has a low level, and a bit line grounding portion fixing a bit line voltage at a ground voltage when the output signal of the sensing circuit is fixed at a low level.

BRIEF DESCRIPTION OF THE DRAWINGS

Various embodiments of an inventive concept will become more apparent in view of the attached drawings and accompanying detailed description, in which.

DETAILED DESCRIPTION OF THE EMBODIMENTS

The present disclosure will be described below with reference to the accompanying drawings through various embodiments.

The present disclosure, however, may be embodied in various different forms, and should not be construed as being limited to the illustrated embodiments herein. Rather, these embodiments are provided as examples so that this disclosure will be thorough and complete, and will fully convey various aspects and features of the present disclosure to those skilled in the art.

It will be understood that, although the terms "first", "second", "third", and so on may be used herein to describe various elements, these elements are not limited by these terms. These terms are used to distinguish one element from another element. Thus, a first element described below could also be termed a second or third element without departing from the spirit and scope of the present disclosure.

The drawings are not necessarily to scale and, in some instances, proportions may have been exaggerated in order to clearly illustrate features of the embodiments.

The terminology used herein is for the purpose of describing particular embodiments only and is not intended to be limiting of the present disclosure. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

In addition, when an element is referred to as being located "on", "over", "above", "under", or "beneath" another element, it is intended to mean relative positional relationship, but not be used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
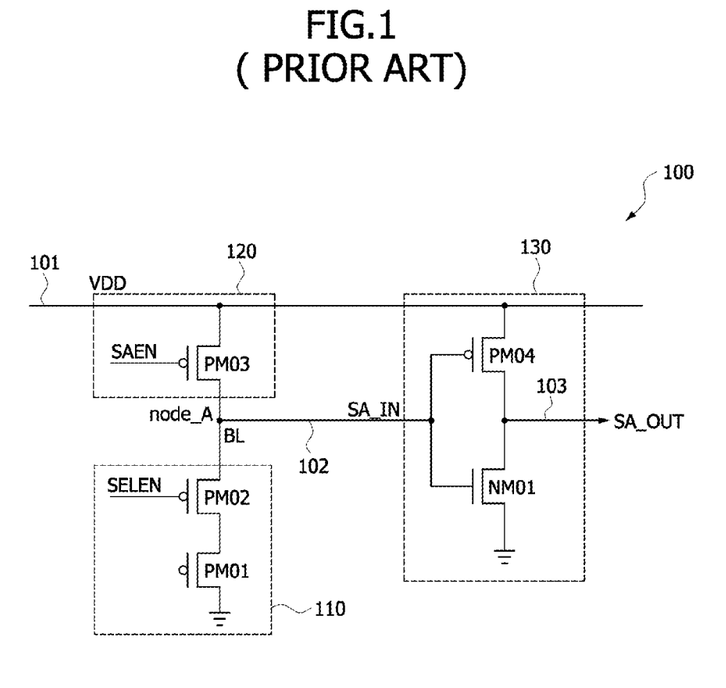
FIG. 1 is a circuit diagram illustrating an example of a general nonvolatile memory device.

FIG. 1 is a circuit diagram illustrating an example of a general nonvolatile memory device 100. Referring to FIG. 1, the nonvolatile memory device 100 consists of a nonvolatile memory cell 110, a resistive load portion 120, and a sensing circuit 130. The nonvolatile memory cell 110 is composed of a first PMOS transistor PM01 acting as a cell transistor, and a second PMOS transistor PM02 acting as a selection transistor. A gate of the first PMOS transistor PM01 corresponds to a floating gate, and a drain of the first PMOS transistor PM01 is coupled to a ground terminal. A source of the first PMOS transistor PM01 is directly coupled to a drain of the second PMOS transistor PM02. A selection enable signal SELEN is applied to a gate of the second PMOS transistor PM02. A source of the second PMOS transistor PM02 is coupled to a first node A through a bit line BL.

The resistive load portion 120 consists of a resistive load coupled between a supply voltage line 101 and the first node A. The resistive load is realized using a third PMOS transistor PM03. A sense amplifier enable signal SAEN is applied to a gate of the third PMOS transistor PM03. A source and a drain of the third PMOS transistor PM03 is coupled to the supply voltage line 101 and the first node A, respectively. If the third PMOS transistor PM03 is turned on, the third PMOS transistor PM03 acts as a resistive component coupled between the supply voltage line 101 and the first node A.

The sensing circuit 130 has a structure of a complementary metal-oxide-semiconductor (CMOS) inverter composed of a first NMOS transistor NM01 and a fourth PMOS transistor PM04. A gate of the first NMOS transistor NM01 and a gate of the fourth PMOS transistor PM04 receive a sensing input signal SA_IN applied through a sensing input line 102. The sensing input line 102 is coupled to the first node A. A source of the first NMOS transistor NM01 is coupled to the ground terminal. A drain of the first NMOS transistor NM01 is coupled to a drain of the fourth PMOS transistor PM04. A source of the fourth PMOS transistor PM04 is coupled to the supply voltage line 101 to which a supply voltage VDD is applied. The drain of the NMOS transistor NM01 and the drain of the fourth PMOS transistor PM04 are coupled to a sensing output line 103. A sensing output signal SA_OUT is outputted through the sensing output line 103.

The first PMOS transistor PM01 acting as a cell transistor has an off-state as an initial state before the cell transistor is programmed and has an on-state as a programmed state after programming of the cell transistor. The initial state means that the first PMOS transistor PM01 has an off-state, and the programmed state means that the first PMOS transistor PM01 has an on-state.

In order to read out a state of the first PMOS transistor PM01, a selection enable signal SELEN of a low level is applied to turn on the second PMOS transistor PM02. A sense amplifier enable signal SAEN of a low level is applied to turn on the third PMOS transistor PM03. A bit line voltage of the first node A has a value obtained by subtracting a voltage drop from a supply voltage VDD applied through the supply voltage line 101, where the voltage drop is due to a resistive component of the turned on third PMOS transistor PM03. The bit line voltage corresponds to the sensing input signal SA_IN. The sensing input signal SA_IN is applied to the sensing circuit 130.

If the first PMOS transistor PM01 has an off-state as an initial state, a resistance between the first node A and the ground terminal has an infinite value, in an ideal case. However, the resistance is substantially not infinite, but shows a very large value compared with a resistance of the turned on third PMOS transistor PM03. Thus, a voltage of the first node A, that is, the sensing input signal SA_IN has a voltage which is substantially equal to the supply voltage VDD. If the sensing input signal SA_IN, which is equal to the supply voltage VDD, is applied to the sensing circuit 130, the first NMOS transistor NM01 is turned on while the fourth PMOS transistor PM04 is not turned on. Since only the first NMOS transistor NM01 is turned on, a ground voltage, for example, 0 V is outputted as the sensing output signal SA_OUT. As such, when the ground voltage is outputted as the sensing output signal SA_OUT of the sensing circuit 130, the first PMOS transistor PM01 acts as the cell transistor is determined to have an initial state.

If the first PMOS transistor PM01 has a programmed state, the resistance between the first node A and the ground terminal has a value of zero, in an ideal case. However, the resistance is substantially not zero, but shows a very small value compared with the resistance of the turned on third PMOS transistor PM03. Thus, the voltage of the first node A, that is, the sensing input signal SA_IN has a voltage which is substantially equal to a ground voltage, for example, 0 V. If the sensing input signal SA_IN of 0 V is inputted to the sensing circuit 130, the first NMOS transistor NM01 is not turned on while the fourth PMOS transistor PM04 is turned on. Since only the fourth PMOS transistor NM01 is turned on, the supply voltage VDD may be outputted as the sensing output signal SA_OUT. As such, when the supply voltage VDD is outputted as the sensing output signal SA_OUT of the sensing circuit 130, the first PMOS transistor PM01 acting as the cell transistor is determined to have a programmed state.

When the first PMOS transistor PM01 has the initial state, if the third PMOS transistor PM03 is turned on to perform a read operation for the first PMOS transistor PM01, a bit line voltage which is close to the supply voltage VDD may be applied to the first node A. The bit line voltage is continuously applied to the first PMOS transistor PM01 acting as the cell transistor during the read operation for the first PMOS transistor PM01. As a size of the supply voltage VDD increases, a characteristic of the first PMOS transistor PM01 may change. In some cases, a read disturbance phenomenon in which a current flows through the first PMOS transistor PM01 to the ground terminal may occur.

Figure 2:
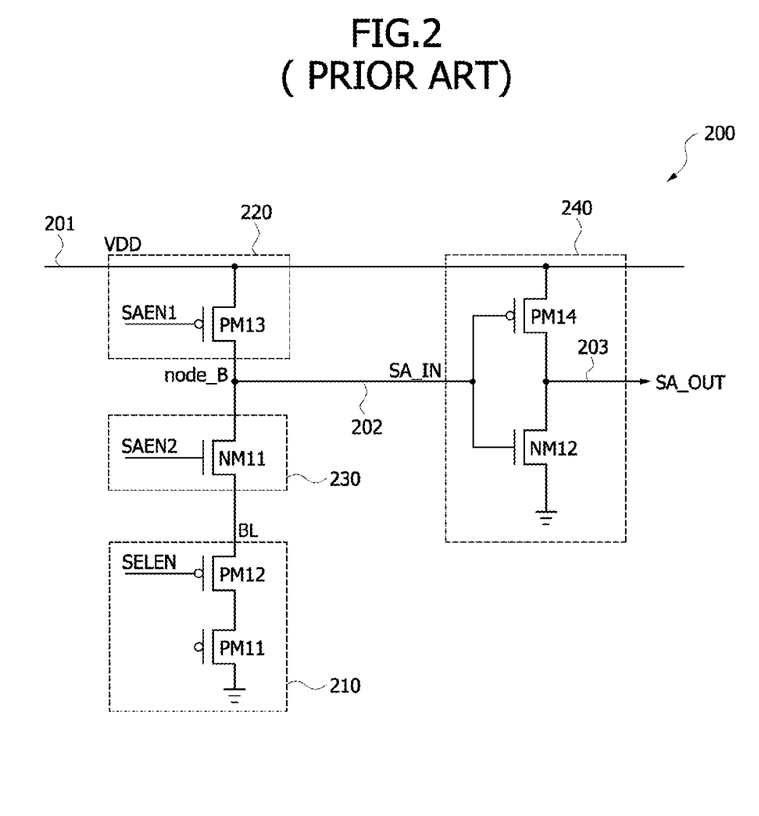
FIG. 2 is a circuit diagram illustrating another example of a general nonvolatile memory device.

FIG. 2 is a circuit diagram illustrating another example of a general nonvolatile memory device 200. Referring to FIG. 2, the nonvolatile memory device 200 consists of a nonvolatile memory cell 210, a resistive load portion 220, a read disturbance suppressing portion 230, and a sensing circuit 240. The nonvolatile memory cell 210 consists of a first PMOS transistor PM11 acting as a cell transistor and a second PMOS transistor PM12 acting as a selection transistor. A gate of the first PMOS transistor PM11 corresponds to a floating gate and a drain of the first PMOS transistor PM11 is coupled to a ground terminal. A source of the first PMOS transistor PM11 is directly coupled to a drain of the second PMOS transistor PM12. A selection enable signal SELEN is applied to a gate of the PMOS transistor PM12. A source of the second PMOS transistor PM12 is coupled to a bit line BL.

The resistive load portion 220 consists of a resistive load coupled between a supply voltage line 201 and a first node B. The resistive load is realized using a third PMOS transistor PM13. A first sense amplifier enable signal SAEN1 is applied to a gate of the third PMOS transistor PM13. A source and a drain of the third PMOS transistor PM13 is coupled to the supply voltage line 201 and the first node B, respectively. If the third PMOS transistor PM13 is turned on, the third PMOS transistor PM13 acts as a resistive component between the supply voltage line 201 and the first node B.

The read disturbance suppressing portion 230 is composed of a first NMOS transistor NM11. A second sense amplifier enable signal SAEN2 is inputted to a gate of the first NMOS transistor NM11. The second sense amplifier enable signal SAEN2 has a value corresponding to an inverted first sense amplifier enable signal SAEN1. A drain and a source of the first NMOS transistor NM11 is coupled to the first node B and the bit line BL, respectively. Therefore, a sensing input line 202 and the bit line BL that are branched from the first node B are separated by the first NMOS transistor NM11.

The sensing circuit 240 has a structure of a CMOS inverter composed of a second NMOS transistor NM12 and a fourth PMOS transistor PM14. A gate of the second NMOS transistor NM12 and a gate of the fourth PMOS transistor PM14 receive a sensing input signal SA_IN applied through the sensing input line 202. The sensing input line 202 is coupled to the first node B. A source of the second NMOS transistor NM12 is coupled to the ground terminal. A drain of the second NMOS transistor NM12 is coupled to a drain of the fourth PMOS transistor PM14. A source of the fourth PMOS transistor PM14 is coupled to the supply voltage line 201 to which a supply voltage VDD is applied. The drain of the second NMOS transistor NM12 and the drain of the fourth PMOS transistor PM14 are coupled to a sensing output line 203. A sensing output signal SA_OUT is outputted through the sensing output line 203.

For a read operation for the first PMOS transistor PM11 acting as the cell transistor, if a first sense amplifier enable signal SAEN1 of a low level and a second sense amplifier enable signal SAEN2 of a high level are applied to the gate of the third PMOS transistor PM13 and the gate of the first NMOS transistor NM11, respectively, a voltage of the first node B coupled to the sensing input line 202 has a value obtained by subtracting a voltage drop due to a resistive component of the third PMOS transistor PM13 from the supply voltage VDD.

A voltage applied to the bit line BL has a value obtained by subtracting a threshold voltage of the first NMOS transistor NM11 from the voltage of the first node B. As such, the voltage of the bit line BL can be decreased from the voltage of the first node B by the threshold voltage of the first NMOS transistor NM11 by disposing the first NMOS transistor NM11. Accordingly, it is possible to suppress a phenomenon in which a characteristic of the first PMOS transistor PM11 having an initial state is changed by the bit line voltage during the read operation. However, the voltage of the first node B coupled to the sensing input line 202 is required to have a value that is necessary to turn on the first NMOS transistor NM11, thus a read margin at a low supply voltage VDD may be reduced.

Figure 3:
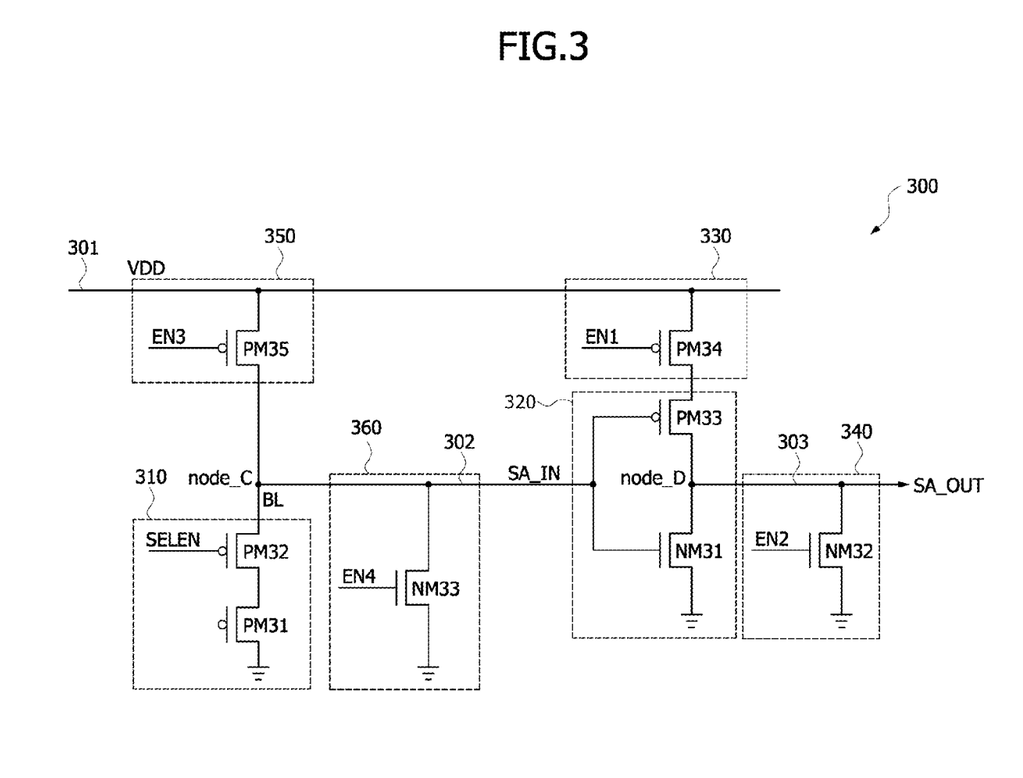
FIG. 3 is a circuit diagram illustrating a nonvolatile memory device according to an embodiment of the present disclosure.

FIG. 3 is a circuit diagram illustrating a nonvolatile memory device 300 according to an embodiment of the present disclosure. Referring to FIG. 3, the nonvolatile memory device 300 may include a nonvolatile memory cell 310, a sensing circuit 320, a first switching portion 330, a sensing output grounding portion 340, a resistive load/second switching portion 350, and a bit line grounding portion 360. The nonvolatile memory cell 310 may be coupled between a first node C and a ground terminal. A bit line BL of the nonvolatile memory cell 310 may be coupled to the first node C.

The sensing circuit 320 may be coupled between a sensing input line 302 coupled to the first node C and a sensing output line 303. The first switching portion 330 may be coupled between a supply voltage line 301 and the sensing circuit 320. The sensing output grounding portion 340 may be coupled between the sensing output line 303 and the ground terminal. The resistive load/second switching portion 350 may be coupled between the supply voltage line 301 and the first node C. The bit line grounding portion 360 may be coupled between the sensing input line 302 and the ground terminal.

The nonvolatile memory cell 310 may be composed of a first PMOS transistor PM31 acting as a cell transistor and a second PMOS transistor PM32 acting as a selection transistor. The first PMOS transistor PM31 may have a floating gate. A drain of the first PMOS transistor may be coupled to the ground terminal. A source of the first PMOS transistor PM31 may be directly coupled to a drain of the second PMOS transistor PM32. A selection enable signal SELEN may be applied to a gate of the second PMOS transistor PM32. A source of the second PMOS transistor PM32 may be coupled to the first node C through the bit line BL.

The sensing circuit 320 may have a structure of a CMOS inverter composed of a first NMOS transistor NM31 and a third PMOS transistor PM33. A gate of the first NMOS transistor NM31 and a gate of the third PMOS transistor PM33 may be coupled in common to the sensing input line 302. The sensing input line 302 may transmit a sensing input signal SA_IN. The sensing input line 302 may be coupled to the first node C. A source of the first NMOS transistor NM31 may be coupled to the ground terminal. A drain of the first NMOS transistor NM31 may be coupled to a drain of the third PMOS transistor PM33. A source of the third PMOS transistor PM33 may be coupled to the supply voltage line 301 through the first switching portion 330. A second node D coupled between the drain of the first NMOS transistor NM31 and the drain of the third PMOS transistor PM33 which may be coupled to the sensing output line 303. A sensing output signal SA_OUT may be outputted through the sensing output line 303.

The first switching portion 330 may be composed of a fourth PMOS transistor PM34 coupled between the supply voltage line 301 and the third PMOS transistor PM33 of the sensing circuit 320. A source of the fourth PMOS transistor PM34 may be coupled to the supply voltage line 301, and a drain of the fourth PMOS transistor PM34 may be coupled to the source of the third PMOS transistor PM33. A first enable signal EN1 may be inputted to a gate of the fourth PMOS transistor PM34. If the fourth PMOS transistor PM34 is turned off, the third PMOS transistor PM33 of the sensing circuit 320 may also be turned off.

The sensing output grounding portion 340 may be composed of a second NMOS transistor NM32 coupled between the sensing output line 303 and the ground terminal. A drain and a source of the second NMOS transistor NM32 may be coupled to the sensing output line 303 and the ground terminal, respectively. A second enable signal EN2 may be inputted to a gate of the second NMOS transistor NM32. If the second enable signal EN2 of a high level is applied to the gate of the second NMOS transistor NM32, the second NMOS transistor NM32 may be turned on. In this case, if the first PMOS transistor PM31 acting as the cell transistor has an initial state and both of the third PMOS transistor PM33 and the fourth PMOS transistor PM34 are turned off, an output signal of the sensing circuit 320 may be fixed at a ground voltage, that is, an output signal of a low level, if the output signal has a low level.

The resistive load/second switching portion 350 may be realized using a resistive load coupled between the supply voltage line 301 and the bit line BL including the first node C. In some embodiments, the resistive load may be composed of a fifth PMOS transistor PM35. The fifth PMOS transistor PM35 may act as a switching device while acting as the resistive load. A third enable signal EN3 may be applied to a gate of the fifth PMOS transistor PM35. A source and a drain of the fifth PMOS transistor PM35 may be coupled to the supply voltage line 301 and the first node C, respectively. If the fifth PMOS transistor PM35 is turned on, the fifth PMOS transistor PM35 may act as a resistive component between the supply voltage line 301 and the first node C. If the fifth PMOS transistor PM35 is turned off, the supply voltage line 301 and the first node C may be electrically opened.

The bit line grounding portion 360 may be composed of a third NMOS transistor NM33 and coupled between the sensing input line 302 and a ground terminal. A drain and a source of the third NMOS transistor NM33 may be coupled to the sensing input line 302 and the ground terminal, respectively. A fourth enable signal EN4 may be applied to a gate of the third NMOS transistor NM33. If the fourth enable signal EN4 of a high level is applied to the gate of the third NMOS transistor NM33, the third NMOS transistor NM33 may be turned on. In this case, if the first PMOS transistor PM31 acting as the cell transistor has an initial state and the second and fifth PMOS transistors PM32 and PM35 are turned on and off, respectively, the sensing input line 302, that is, the bit line BL may be fixed at the ground voltage if, for example, the output signal of the sensing circuit 320 is fixed at a low level.

The first enable signal EN1, the second enable signal EN2, the third enable signal EN3, and the fourth enable signal EN4, that are applied to the gate of the fourth PMOS transistor PM34, the gate of the second NMOS transistor NM32, the gate of the fifth PMOS transistor PM35, and the gate third NMOS transistor NM33 of the nonvolatile memory device 300 according to an embodiment, may be outputted by an enable signal generator. The enable signals outputted from the enable signal generator may be outputted in an order of the first enable signal EN1, the second enable signal EN2, the third enable signal EN3, and the fourth enable signal EN4. Therefore, a switching operation of the fourth PMOS transistor PM34, a switching operation of the second NMOS transistor NM32, a switching operation of the fifth PMOS transistor PM35, and a switching operation of the third NMOS transistor NM33 may be sequentially executed.

Figure 4:
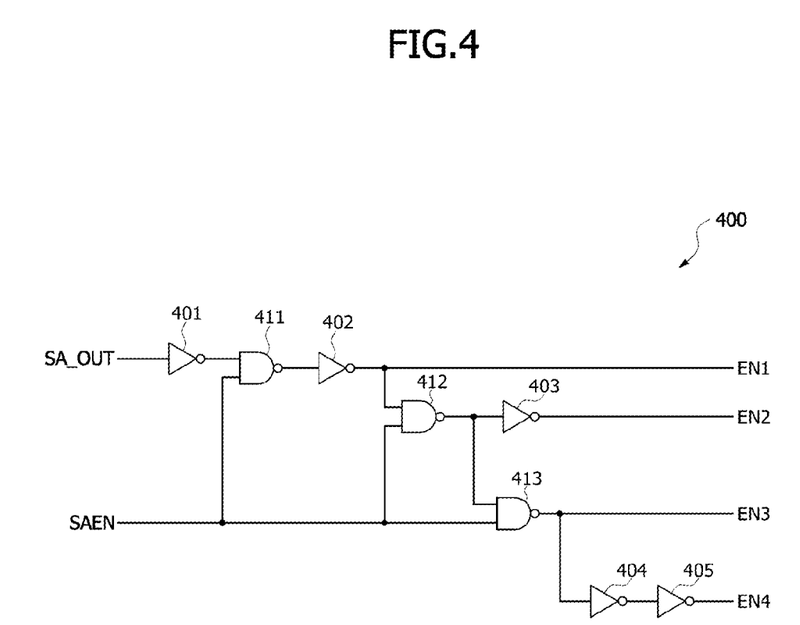
FIG. 4 is a circuit diagram illustrating an enable signal generator employed in a nonvolatile memory device according an embodiment of the present disclosure.

FIG. 4 is a circuit diagram illustrating an enable signal generator 400 employed in a nonvolatile memory device according an embodiment of the present disclosure. Referring to FIG. 4, the enable signal generator 400 may receive a sensing output signal SA_OUT from the sensing output line 303 (see FIG. 3) and a sense amplifier enable signal SAEN, and may output a first enable signal EN1, a second enable signal EN2, a third enable signal EN3, and a fourth enable signal EN4. The first enable signal EN1, the second enable signal EN2, the third enable signal EN3 and the fourth enable signal EN4 may be sequentially outputted. The enable signal generator 400 may include a first inverter 401 to which the sensing output signal SA_OUT is applied. An output signal of the first inverter 401 may be applied to a first NAND gate 411 along with the sense amplifier enable signal SAEN. An output signal of the first NAND gate 411 may be applied to a second inverter 402. An output signal of the second inverter 402 may constitute the first enable signal EN1.

The output signal of the second inverter 402 may be applied to a second NAND gate 412 with the sense amplifier enable signal SAEN. An output signal of the second NAND gate 412 may be applied to a third inverter 403. An output signal of the third inverter 403 may constitute the second enable signal EN2. The output signal of the second NAND gate 412 may be applied to a third NAND gate 413 with the sense amplifier enable signal SAEN. An output signal of the third NAND gate 413 may constitute the third enable signal EN3. The output signal of the third NAND gate 413 may be applied to a fourth inverter 404. An output signal of the fourth inverter 404 may be applied to a fifth inverter 405. An output signal of the fifth inverter 405 may constitute the fourth enable signal EN4.

Figure 5:
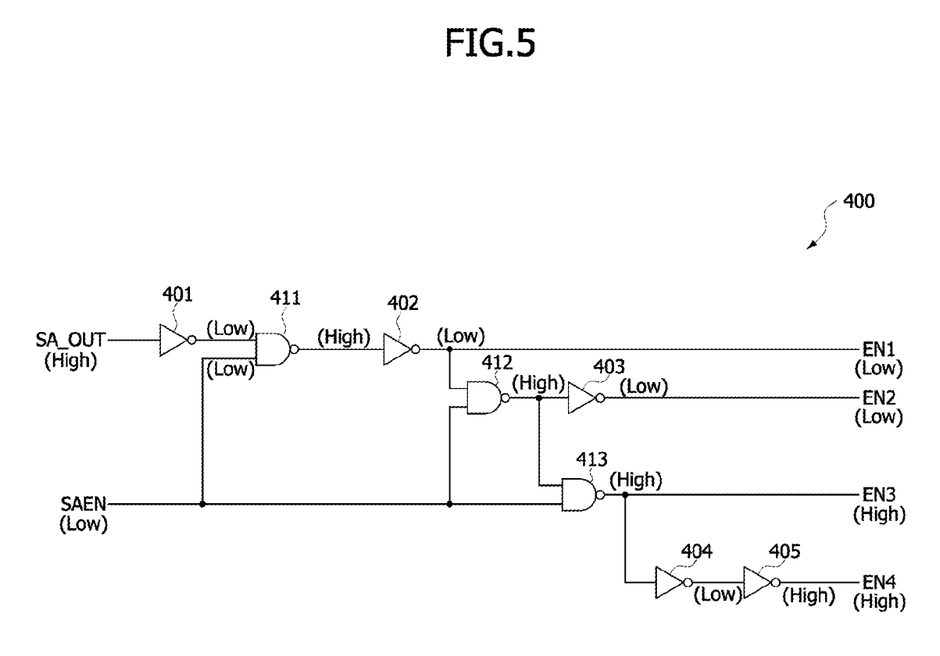
FIG. 5 is a circuit diagram illustrating an operation of an enable signal generator employed in the nonvolatile memory device of FIG. 3 before a read operation.
Figure 6:
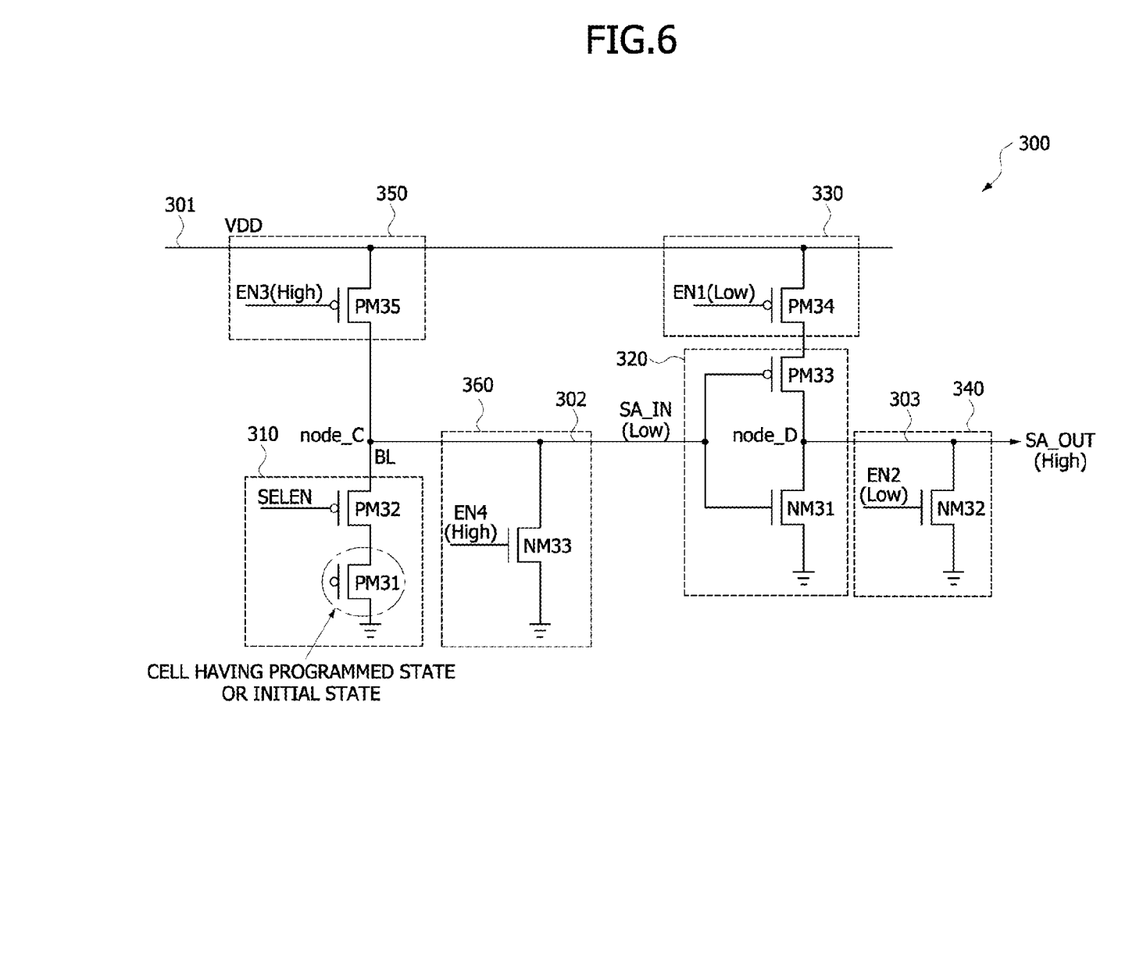
FIG. 6 is a circuit diagram illustrating a state of the nonvolatile memory device of FIG. 3 before a read operation.

FIG. 5 is a circuit diagram illustrating an operation of the enable signal generator 400 before a read operation of the nonvolatile memory device of FIG. 3. FIG. 6 is a circuit diagram illustrating a state of the nonvolatile memory device of FIG. 3 before the read operation. In FIGS. 5 and 6, the same reference numerals or designators as used in FIGS. 3 and 4 denote the same elements.

Referring to FIGS. 5 and 6, if the sense amplifier enable signal SAEN is of a low level, the sensing output signal SA_OUT may be set to a high level (e.g., a high signal) prior to a read operation for the nonvolatile memory device. Since a read operation is not performed yet, it has not been determined whether the first PMOS transistor PM31 acting as the cell transistor has a programmed state or an initial state. The sense amplifier enable signal SAEN maintains a state of a low level. As illustrated in FIG. 5, the sensing output signal SA_OUT of a high level and the sense amplifier enable signal SAEN of a low level are applied to the enable signal generator 400.

The first inverter 401 may output a signal of a low level. The first NAND gate 411 receives the signal of a low level and the sense amplifier enable signal SAEN of a low level, and the first NAND gate 411 may output a signal of a high level and transmit the signal to the second inverter 402. When the first NAND gate 411 receives the sense amplifier enable signal SAEN of a low level, the first NAND gate 411 may output a signal of a high level regardless a signal level of the sensing output signal SA_OUT. The second inverter 402 may output a signal of a low level. The signal outputted from the second inverter 402 may constitute the first enable signal EN1 of a low level.

The second NAND gate 412 receives the signal of a low level outputted from the second inverter 402 and the sense amplifier enable signal SAEN of a low level may output a signal of a high level and transmit the signal to the third inverter 403. The second NAND gate 412 receives the sense amplifier enable signal SAEN of a low level and may output a signal of high level regardless of a signal level of the output signal of the second inverter 402. The third inverter 403 may output a signal of a low level. An output signal of the third inverter 403 may constitute the second enable signal EN2 of a low level. The third NAND gate 413 receives the signal of a high level outputted from the second NAND gate 412 and the sense amplifier enable signal SAEN of a low level may output a signal of a high level. The third NAND gate 413 receives the sense amplifier enable signal SAEN of a low level may output a signal of a high level regardless of a signal level of the output signal of the second NAND gate 412. An output signal of the third NAND gate 413 may constitute the third enable signal EN3 of a high level. The signal of a high level outputted from the third NAND gate 413 may be inputted to the fourth inverter 404. The fourth inverter 404 may output a signal of a low level and transmit the signal to the fifth inverter 405. An output signal of the fifth inverter 405 may constitute the fourth enable signal EN4 of a high level.

The first enable signal EN1 of a low level, the second enable signal EN2 of a low level, the third enable signal EN3 of a high level, and the fourth enable signal EN4 of a high level may be supplied before the read operation of the nonvolatile memory cell. As such, if the first enable signal EN1 of a low level, the second enable signal EN2 of a low level, the third enable signal EN3 of a high level, and the fourth enable signal EN4 of a high level are sequentially outputted, as illustrated in FIG. 6, the fourth PMOS transistor PM34 of the first switching portion 330 may be turned on. The second NMOS transistor NM32 of the sensing output grounding portion 340 may be turned off. The fifth PMOS transistor PM35 of the resistive load/second switching portion 350 may be turned off. The third NMOS transistor NM33 of the bit line grounding portion 360 may be turned on. Since the fifth PMOS transistor PM35 is turned off and the third NMOS transistor NM33 is turned on, a ground voltage may be applied to the first node C, that is, the bit line BL and the sensing input line 302. Since the second NMOS transistor NM32 is turned off and a signal of a low level is applied to the sensing input line 302, the first NMOS transistor NM31 of the sensing circuit 320 may be turned off while the third PMOS transistor PM33 of the sensing circuit 320 may be turned on. Therefore, the sensing output signal SA_OUT may maintain a state of a high level.

Figure 7:
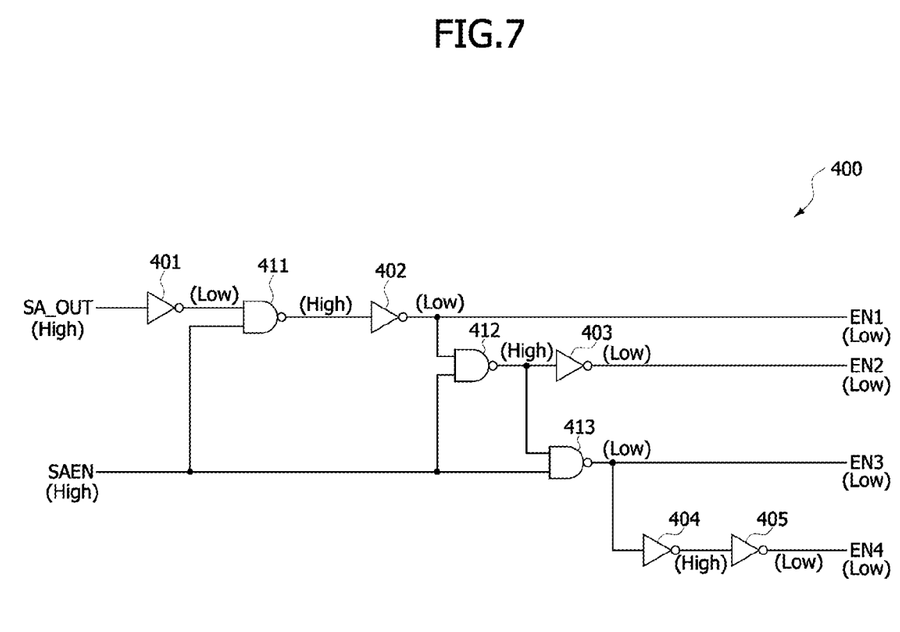
FIG. 7 is a circuit diagram illustrating an operation of an enablement signal generator employed in the nonvolatile memory device of FIG. 3 after starting a read operation for a cell transistor.

FIG. 7 is a circuit diagram illustrating an operation of the enable signal generator 400 after starting a read operation for a cell transistor of the nonvolatile memory device of FIG. 3. In FIG. 7, the same reference numerals or designators as used in FIG. 4 denote the same elements. Referring to FIG. 7, after the read operation starts, the sense amplifier enable signal SAEN is changed from a low level into a high level. Since the sense amplifier enable signal SAEN is changed into a high level, the read operation for the cell transistor is performed. If the sense amplifier enable signal SAEN is changed from a low level into a high level, the enable signal generator 400 generates new enable signals. Specifically, as shown in FIG. 7, a sensing output signal SA_OUT of a high level and the sense amplifier enable signal SAEN of a high level are applied to the enable signal generator 400. The first inverter 401 may output a signal of a low level. The first NAND gate 411 receives the signal of a low level outputted from the first inverter 401 and the sense amplifier enable signal SAEN of a high level and the first NAND gate 411 may output a signal of a high level and transmits the signal to the second inverter 402. An output signal of the second inverter 402 may constitute the first enable signal EN1 of a low level.

The second NAND gate 412 receives the signal of a low level outputted from the second inverter 402 and the sense amplifier enable signal SAEN of a high level, and the second NAND gate 412 may output a signal of a high level and transmit the signal to the third inverter 403. The third inverter 403 may output a signal of a low level. An output signal of the third inverter 403 may constitute the second enable signal EN2 of a low level. The third NAND gate 413 receives the signal of a high level outputted from the second NAND gate 412 and the sense amplifier enable signal SAEN of a high level may outputs a signal of a low level. An output signal of the third NAND gate 413 may constitute the third enable signal EN3 of a low level. The signal of a low level outputted from the third NAND gate 413 may be applied to the fourth inverter 404. The fourth inverter 404 may output a signal of a high level and transmit the signal to the fifth inverter 405. An output signal of the fifth inverter 405 may constitute the fourth enable signal EN4 of a low level.

Figure 8:
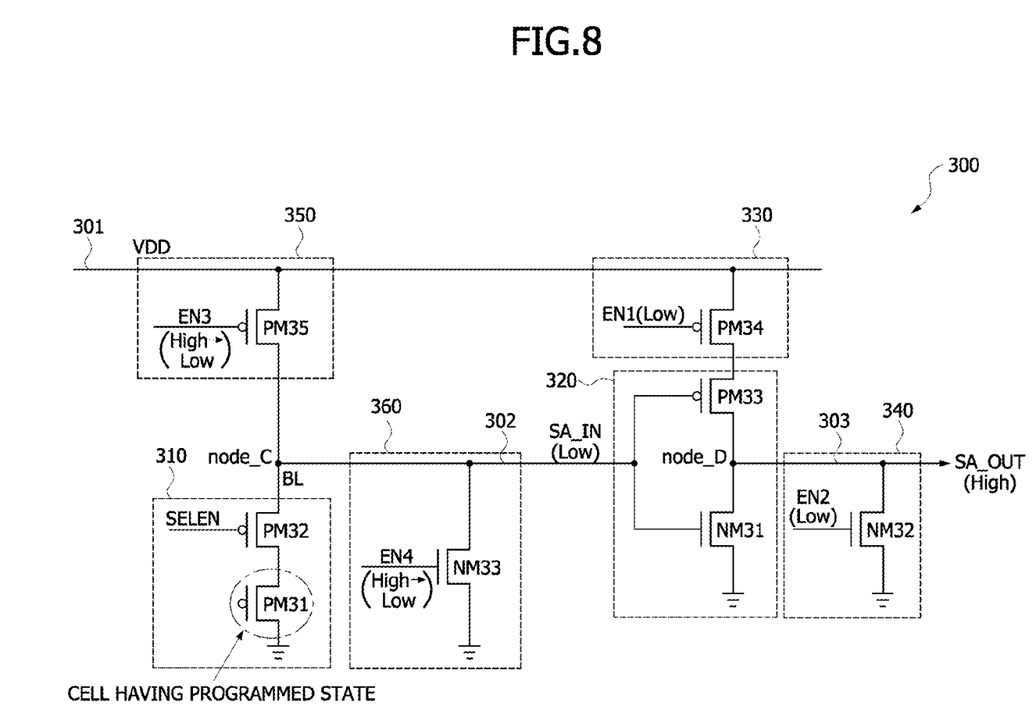
FIG. 8 is a circuit diagram illustrating a read operation of the nonvolatile memory device of FIG. 3 after starting a read operation for a programmed cell transistor.

FIG. 8 is a circuit diagram illustrating a read operation after starting the read operation for a programmed cell transistor of the nonvolatile memory device of FIG. 3. In FIG. 8, the same reference numerals or designators as used in FIG. 3 denote the same elements. Referring to FIG. 8, since the first enable signal EN1 maintains a state of a low signal, the fourth PMOS transistor PM34 of the first switching portion 330 may maintain an on-state. In addition, since the second enable signal EN2 maintains a state of a low signal, the second NMOS transistor NM32 of the sensing output grounding portion 340 may maintain an off-state. Accordingly, the sensing circuit 320 may output a voltage of the second node D as a sensing output signal SA_OUT. Since the third enable signal EN3 is changed from a high signal into a low signal, the fifth PMOS transistor PM35 of the resistive load/second switching portion 350 may be turned on. Since the fourth enable signal EN4 is changed from a high signal into a low signal, the third NMOS transistor NM33 may be turned off. As such, the first enable signal EN1, the second enable signal EN2, the third enable signal EN3, and the fourth enable signal EN4 each having a low level may be supplied after starting the read operation for the nonvolatile memory cell.

When the first PMOS transistor PM31 is a memory cell having a programmed state, the sensing input signal, that is, a voltage applied to the first node C may become a signal of a low level.

Accordingly, the first NMOS transistor NM31 constituting the sensing circuit 320 is turned off while the third PMOS transistor PM33 constituting the sensing circuit 320 may be turned on. Since the second NMOS transistor NM32 maintains an off-state and the fourth PMOS transistor PM34 maintains an on-state, the sensing output signal SA_OUT which is outputted from the sensing output line 303 may maintain a state of a high signal. As such, if the sensing output signal SA_OUT is sensed as a signal of a high level for a predetermined time period, the first PMOS transistor PM31 acting as the cell transistor may be determined as a programmed cell. During the read operation for the first PMOS transistor PM31 having a programmed state, because the bit line BL voltage maintains a voltage close to a ground voltage, the first PMOS transistor PM31 may possibly not be stressed from the bit line voltage.

Figure 9:
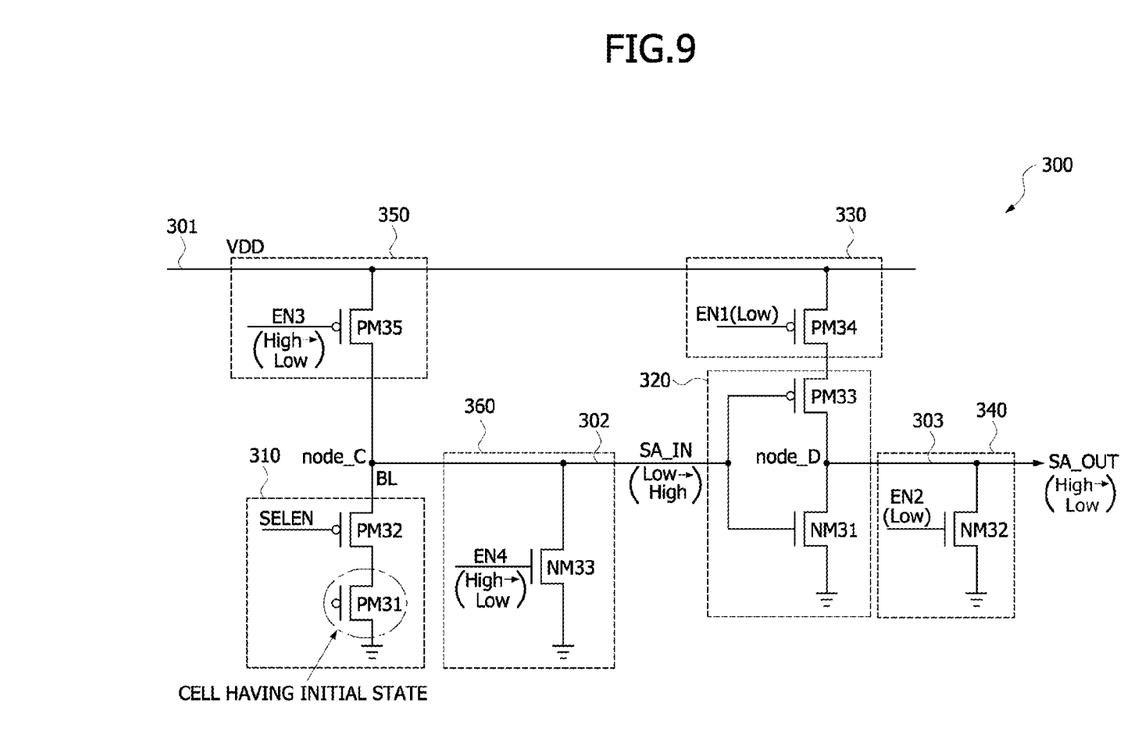
FIG. 9 is a circuit diagram illustrating a read operation of the nonvolatile memory device of FIG. 3 after starting a read operation for a cell transistor having an initial state.

FIG. 9 is a circuit diagram illustrating a read operation of the nonvolatile memory device of FIG. 3 after starting the read operation for a cell transistor having an initial state. In FIG. 9, the same reference numerals or designators as used in FIG. 3 denote the same elements. Referring to FIG. 9, since the first enable signal EN1 maintains a state of a low signal, the fourth PMOS transistor PM34 of the first switching portion 330 may maintain an on-state. In addition, since the second enable signal EN2 maintains a state of a low signal, the second NMOS transistor NM32 of the sensing output grounding portion 340 may maintain an off-state. Accordingly, the sensing circuit 320 outputs a voltage of the second node D as a sensing output signal SA_OUT. Since the third enable signal EN3 is changed from a high signal into a low signal, the fifth PMOS transistor PM35 of the resistive load/second switching portion 350 may be turned on. Since the fourth enable signal EN4 is changed from a high signal into a low signal, the third NMOS transistor NM33 may be turned off.

When the first PMOS transistor PM31 is a memory cell having an initial state, the sensing input signal SA_IN may be changed from a low signal into a high signal. Accordingly, the first NMOS transistor NM31 constituting the sensing circuit 320 may be turned on while the third PMOS transistor PM33 constituting the sensing circuit 320 may be turned off. Since the second NMOS transistor NM32 maintains an off-state, the sensing output signal SA_OUT which is outputted from the sensing output line 303 may be changed from a high signal into a low signal. When the sensing output signal SA_OUT is sensed as a low signal, the first PMOS transistor PM31 may be determined as a memory cell having an initial state. If the state of the first PMOS transistor is determined as a memory cell having an initial state, that is, the sensing output signal of a low level is outputted, a ground voltage is applied to the bit line BL while maintaining the sensing output signal SA_OUT of a low level, thereby suppressing the nonvolatile memory cell 310 from being stressed from the bit line BL voltage.

Figure 10:
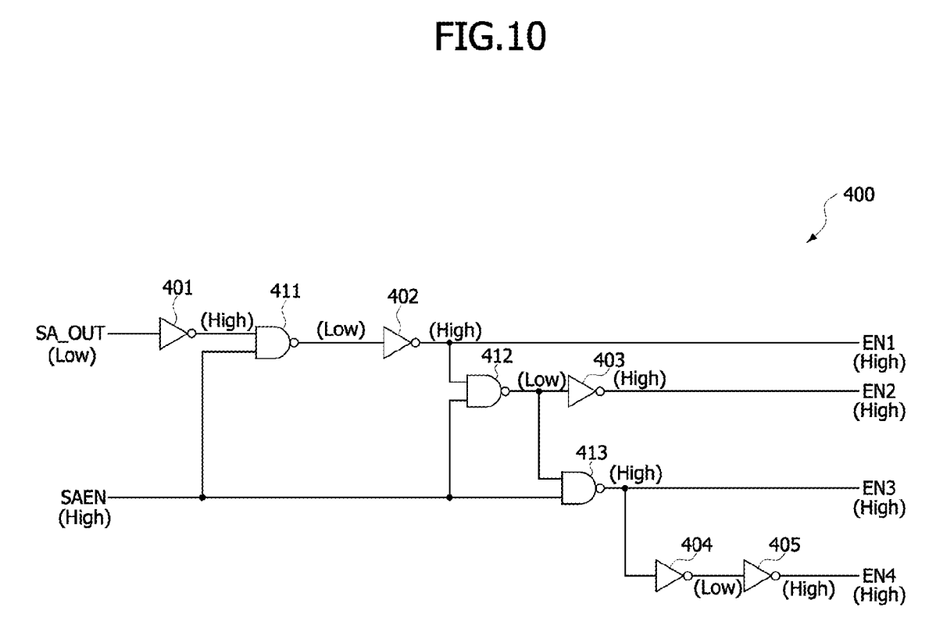
FIG. 10 is a circuit diagram illustrating operation of an enablement signal generator employed in the nonvolatile memory device of FIG. 3 after determining an initial state of a cell transistor by a read operation for the cell transistor.

FIG. 10 is a circuit diagram illustrating an operation of the enable signal generator 400 employed in the nonvolatile memory device of FIG. 3 after determining by the read operation for the cell transistor having an initial state. In FIG. 10, the same reference numerals or designators as used in FIG. 4 denote the same elements. Referring to FIG. 10, after determining an initial state of the cell transistor, if the sensing output signal SA_OUT is changed from a high signal into a low signal, the enable signal generator 400 may generate new enable signals. Specifically, the sensing output signal SA_OUT of a low level and the sense amplifier enable signal SAEN of a high level are applied to the enable signal generator 400. The first inverter 401 may output a signal of a high level. The first NAND gate 411 receives the signal of a high level outputted from the first inverter 401 and the sense amplifier enable signal SAEN of a high level may output a signal of a low level and the first NAND gate 411 transmits the signal to the second inverter 402. The second inverter 402 may output a signal of a high level. An output signal of the second inverter 402 may constitute a first enable signal EN1 of a high level.

The second NAND gate 412 receives the signal of a high level which is outputted from the second inverter 402 and the sense amplifier enable signal SAEN of a high level the second NAND gate 412 may output a signal of a low level and transmit the signal to the third inverter 403. The third inverter 403 may output a signal of a high level. An output signal of the third inverter 403 may constitute the second enable signal EN2 of a high level. The third NAND gate 413 receives the signal of a low level which is outputted from the second NAND gate 412 and the sense amplifier enable signal SAEN of a high level, and the third NAND gate 413 may output a signal of a high level. An output signal of the third NAND gate 413 may constitute the third enable signal EN3 of a high level. The signal of a high level which is outputted from the third NAND gate 413 may be applied to the fourth inverter 404. The fourth inverter may output a signal of a low level and transmit the signal to the fifth inverter 405. An output signal of the fifth inverter 405 may constitute the fourth enable signal EN4 of a high level. As such, if the sensing output signal SA_OUT is changed from a high signal into a low signal during the read operation for the nonvolatile memory cell, the enable signal generator 400 may generate high signals, that is, the first to fourth enable signals EN1, EN2, EN3 and EN4.

Figure 11:
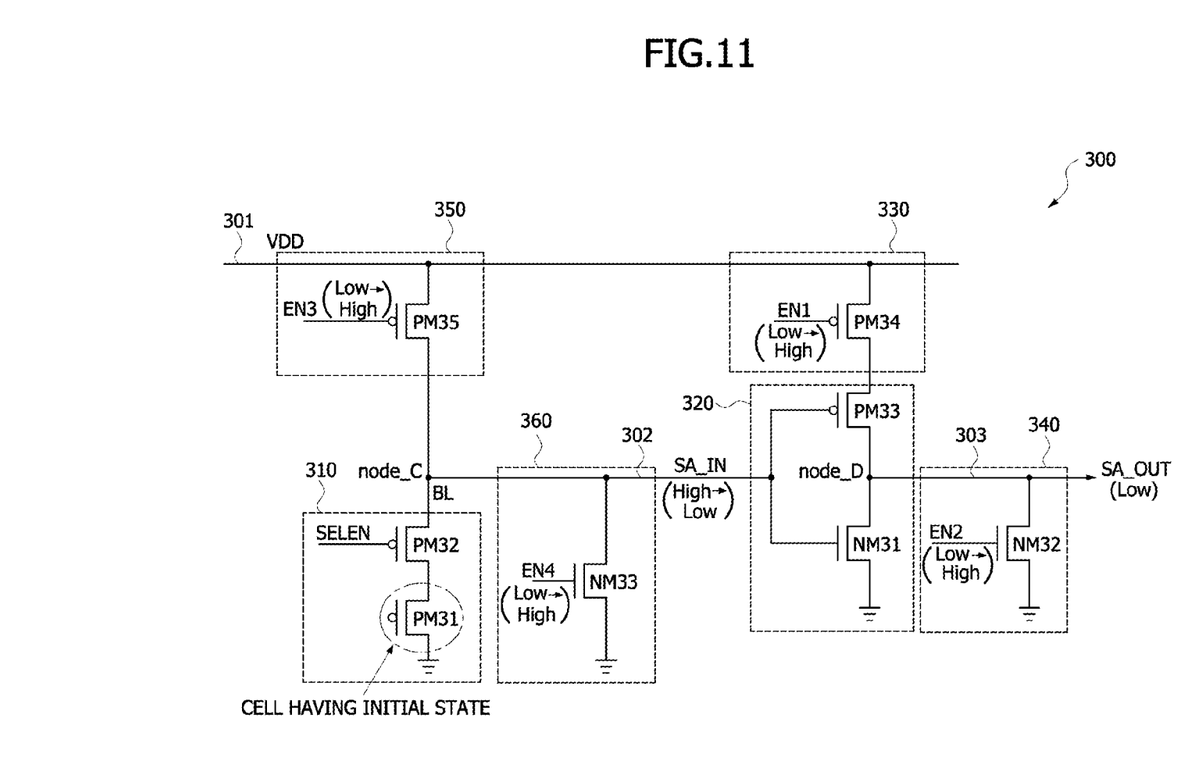
FIG. 11 is a circuit diagram illustrating operation of the nonvolatile memory device of FIG. 3 after determining a state of a cell transistor having an initial state

FIG. 11 is a circuit diagram illustrating an operation of the nonvolatile memory device of FIG. 3 after determining a state of a cell transistor having an initial state. In FIG. 11, the same reference numerals or designators as used in FIG. 3 denote the same elements. Referring to FIG. 11, since the first enable signal EN1 is changed from a low signal into a high signal, the fourth PMOS transistor PM34 of the first switching portion 330 may be turned off. Accordingly, an electrical connection between the supply voltage line 301 and the sensing circuit 320 may become an open circuit state. Since the second enable signal EN2 is changed from a low signal into a high signal, the second NMOS transistor NM32 of the sensing output grounding portion 340 may be turned on. Thus, the sensing output line 303 may maintain a ground voltage, and the sensing output signal SA_OUT may be maintained as a low signal.

Since the third enable signal EN3 is changed from a low signal into a high signal, the fifth PMOS transistor PM35 of the resistive load/second switching portion 350 may be turned off. Thus, an electrical connection between the supply voltage line 301 and the bit line BL may become an open circuit state. Since the fourth enable signal EN4 is changed from a low signal to a high signal, the third NMOS transistor NM33 may be turned on. Accordingly, a ground voltage may be applied to the first node C, that is, the ground voltage may be applied to the bit line BL and the sensing input line 302. In other words, the first PMOS transistor PM31 acting as the cell transistor may not be stressed from the bit line BL voltage until all the read operations are finished.

According to some embodiments, when performing a read operation for a cell transistor having an initial state, after a state of the cell transistor is determined, a bit line voltage is fixed at a ground voltage while maintaining a sensing output voltage. Accordingly, the cell transistor may not be stressed from the bit line BL voltage until all the read operations are finished.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a nonvolatile memory cell coupled between a bit line and a ground terminal and comprising a first PMOS transistor and a second PMOS transistor;
a sensing circuit comprising a third PMOS transistor and a first NMOS transistor, wherein gates of the third PMOS transistor and the first NMOS transistor are coupled to the bit line, and drains of the third PMOS transistor and the first NMOS transistor are coupled to a sensing output line, and a source of the first NMOS transistor is coupled to the ground terminal;
a first switching portion comprising a fourth PMOS transistor having a gate to which a first enable signal is applied, a source coupled to a supply voltage line, and a drain coupled to a source of the third PMOS transistor;
a sensing output grounding portion comprising a second NMOS transistor having a gate to which a second enable signal is applied, a drain coupled to the sensing output line, and a drain coupled to the ground terminal;
a resistive load/second switching portion comprising a fifth PMOS transistor having a gate to which a third enable signal is applied, a source coupled to the supply voltage line, and a drain coupled to the bit line;
a bit line grounding portion comprising a third NMOS transistor having a gate to which a fourth enable signal is applied, a drain coupled to the bit line, and a source coupled to the ground terminal; and
an enable signal generator receiving a sensing output signal from the sensing output line and a sense amplifier enable signal, and generating the first to fourth enable signals,
wherein the enable signal generator configured to sequentially supply the first to fourth enable signal of high level if a sensing output signal of the sensing output line is changed from a high level into a low level.

2. The nonvolatile memory device of claim 1,
wherein the first PMOS transistor having a floating gate, a source, and a drain coupled to the ground terminal, and
the second PMOS transistor having a gate coupled to a selection enable signal line, a source coupled the bit line, and a drain coupled to the source of the first PMOS transistor.

3. The nonvolatile memory device of claim 1, wherein the enable signal generator comprises:
a first inverter to which the sensing output signal is applied;
a first NAND gate to which an output signal from the first inverter and the sense amplifier enable signal are applied;
a second inverter to which an output signal of the first NAND gate is applied and which outputs the first enable signal;
a second NAND gate to which an output signal of the second inverter and the sense amplifier enable signal are applied;
a third inverter to which an output signal of the second NAND gate is applied and which outputs the second enable signal;
a third NAND gate to which the output signal of the second NAND gate and the sense amplifier enable signal are applied and which outputs the third enable signal;
a fourth inverter to which an output signal of the third NAND gate is applied; and
a fifth inverter to which an output signal of the fourth inverter is applied and which outputs the fourth enable signal,
wherein the sensing output signal of high level and the sense amplifier enable signal of low level are applied to the first inverter and the first NAND pate, respectively before the read operation for the nonvolatile memory cell, and
wherein the sense amplifier enable signal of high level is applied to the first NAND gate after starting the read operation for the nonvolatile memory cell.

4. The nonvolatile memory device of claim 1,
wherein the enable signal generator configured to sequentially supply the first enable signal of low level, the second enable signal of low level, the third enable signal of high level, and the fourth enable signal of high level before the read operation for the nonvolatile memory cell.

5. The nonvolatile memory device of claim 4,
wherein the enable signal generator configured to sequentially supply the first to fourth enable signals of low level, after starting the read operation for the nonvolatile memory cell.

* * * * *